(12) United States Patent
Clerc

(10) Patent No.: US 7,924,078 B2
(45) Date of Patent: Apr. 12, 2011

(54) BISTABLE CIRCUIT WITH AUTO-TIME-ADJUSTED SWITCHING, AND FLIP-FLOP USING SUCH A BISTABLE CIRCUIT

(75) Inventor: Silvain Clerc, Grenoble (FR)

(73) Assignee: STMicroelectronics, SA, Montrouge (FR)

( * ) Notice: Subject to any disclaimer, the term of this patent is extended or adjusted under 35 U.S.C. 154(b) by 86 days.

(21) Appl. No.: 11/893,997

(22) Filed: Aug. 16, 2007

(65) Prior Publication Data

US 2008/0054972 A1    Mar. 6, 2008

(30) Foreign Application Priority Data

Aug. 16, 2006  (FR) ...................... 06 07335

(51) Int. Cl.
*H03K 3/356* (2006.01)
(52) U.S. Cl. ........ 327/211; 327/203; 327/212; 327/214; 327/218
(58) Field of Classification Search .......... 327/202, 327/203, 208, 210–212, 214, 215, 218, 219
See application file for complete search history.

(56) References Cited

U.S. PATENT DOCUMENTS

| 6,181,180 | B1 * | 1/2001 | Chen et al. | 327/211 |
|---|---|---|---|---|
| 6,229,360 | B1 * | 5/2001 | Mizuno et al. | 327/141 |
| 6,597,223 | B2 * | 7/2003 | Vangal et al. | 327/202 |
| 7,180,350 | B2 * | 2/2007 | Hsieh et al. | 327/218 |
| 2005/0195007 | A1 * | 9/2005 | Hsieh et al. | 327/218 |
| 2005/0195008 | A1 * | 9/2005 | Hsieh et al. | 327/218 |

FOREIGN PATENT DOCUMENTS

WO    02/49214    6/2002

OTHER PUBLICATIONS

French Search Report for French Patent Application No. FR0607335, dated Feb. 8, 2007.
Partovi H, et al: "Flow-Through Latch and Edge-Triggered Flip-Flop Hybrid Elements", IEEE International Solid State Circuits Conference, IEEE Service Center, New York, US, vol. 39, pp. 138-139, XP000685568.

* cited by examiner

*Primary Examiner* — Lincoln Donovan
*Assistant Examiner* — William Hernandez
(74) *Attorney, Agent, or Firm* — Lisa K. Jorgenson; Kevin D. Jablonski; Graybeal Jackson LLP

(57) ABSTRACT

Bistable circuit switching at the edges of a clock signal, including means for pre-charging an intermediate node of the circuit, delay means including a chain of inverters defining a time window around an edge of said clock signal, means for discharging the intermediate node controlled by at least one input data item making it possible to discharge the intermediate node for the duration of said time window, characterized in that the delay means include means for temporally adjusting the duration of the time window to the time for discharging the intermediate node through said discharge means.

30 Claims, 2 Drawing Sheets

BISTABLE CIRCUIT WITH AUTO-TIME-ADJUSTED SWITCHING, AND FLIP-FLOP USING SUCH A BISTABLE CIRCUIT

PRIORITY CLAIM

This application claims priority from French patent application No. 06/07335, filed Aug. 16, 2006, which is incorporated herein by reference.

TECHNICAL FIELD

An embodiment of this invention relates to a bistable circuit and, in particular, to a bistable circuit capable of being involved in the production of a latch, a flip-flop, and so on.

BACKGROUND

A flip-flop is a component commonly used in microelectronics to store a binary value or "state". A common way of producing it is to assemble two latches, respectively called a master latch and a slave latch. A latch is typically a bistable circuit, of which the structure, known in itself, includes two inverters connected head-to-tail. One or the other or both of these inverters can be tristate inverters.

The flip-flop has two distinct periods:
a transparent period during a short time window around an edge of the clock signal, during which an input data item can be transferred to the level of the flip-flop output, and
a storage period, in which the latch maintains the state of its output regardless of the input data. During this period, the output of the latch therefore provides the most recent information that has passed through it in its previous transparent state.

In the case of a flip-flop triggered on a rising clock edge, the first latch (master) is transparent when the clock signal is at low level (logic 0) and in storage mode when the clock signal is at high level (logic 1). The second latch (slave) is transparent when the clock signal is high level and in storage mode when the clock signal is at low level. Thus, the resulting latch is transparent during the rising edge of the clock signal.

An example of this type of latch, based on a so-called "Hybrid Latch Flip-Flop" (HLFF) architecture, is presented in the article "Flow-through latch and edge triggered flip-flop hybrid elements" of H. Partovi et al., IEEE 1996, International Solid State Circuit Conference, which is incorporated by reference.

FIG. 1 shows an embodiment according to the prior art of the master latch of an HLFF-type flip-flop. The operation of this latch is based on the use of a delayed clock signal. To this end, the bistable structure of the master latch integrates a delay chain based on CH inverters. The delay chain CH includes three series-connected inverters I1, I2 and I3. The inverter I1 receives, at the input, the clock signal CLK, so that the inverse clock signal CLK/ delayed three times through the three inverters I1, I2 and I3 is generated at the output of the inverter chain.

In the detail, a first inverter of the bistable circuit of FIG. 1 is constituted by a pMos-type transistor P1, of which a source is connected to a power supply source Vdd of the circuit and of which a gate is connected to the clock input CLK of the circuit, and three nMos-type transistors, respectively MN1, MN2 and MN3, connected in series between the drain of the transistor P1 and a ground of the circuit. The gate of transistor MN1 is controlled by the delayed inverse clock signal CLK/ delivered at the output of the delay chain CH. The gate of transistor MN2 is controlled by an input data item Data and the gate of transistor MN3 is controlled by the clock signal CLK. The common point M of transistors P1 and MN1 is connected to the input of a second inverter of the bistable circuit providing the output Out and by means of which the first inverter is looped back to its input.

The second inverter is formed by three Mos transistors P2, N2 and N3, connected in series between the supply voltage Vdd and a ground of the circuit. In the detail, the pMos-type transistor P2 has its source connected to the power supply voltage Vdd of the circuit, and its drain connected to the drain of the nMos-type transistor N2 so as to provide the output Out, with the gates of transistors P2 and N2 being connected together to the intermediate node M of the bistable circuit. The source of transistor N2 is connected to the drain of the nMos-type transistor N3, of which the source is connected to the ground of the circuit and of which the gate is connected to the clock input CLK of the circuit.

The operation of the circuit of FIG. 1 is as follows. When the clock signal CLK is at low level, the node M is pre-charged to Vdd by means of transistor P1 which is turned on, with the path to the ground being closed by means of transistor MN3, which is off, whereas transistor MN1 is on due to the inverse clock signal CLK/ at high level applied to its gate.

In a next clock edge, the signal CLK switches to high level. Transistor MN3 is then turned on. As the inverter-based delay chain CH creates a certain delay, the inverse clock signal CLK/ applied to the gate of MN1 is therefore kept at high level for the duration of this delay, leaving transistor MN1 on. During the delay created by the delay chain CH, there is therefore a time window during which transistors MN1 and MN3 are simultaneously on. At the end of this delay, the delayed clock signal CLK/ will drop to low level, then controlling the closing of the path constituted by the nMos transistors MN1, MN2 and MN3.

Thus, during the short time window available around the clock edge following the pre-charge phase during which transistors MN1 and MN3 are simultaneously on:
if the data input signal Data is at low level, the path of the nMos transistors MN1 to MN3 is blocked and the intermediate node M is kept at high level at its pre-charge value. A logic 0 is then transmitted to the level of the output Out, since the two nMos N2 and N3 are on;
if, on the other hand, the data input signal Data is at high level, MN2 is turned on, which opens the path of transistors MN1 to MN3 and the intermediate node M is discharged (pulled to the ground) by means of the three transistors MN1 to MN3. A logic 1 is then transmitted to the level of the output Out, and transistor N2 is again turned off while P2 is on.

The flip-flop is therefore transparent for the duration of the delay created by the delay chain, defining a time window in which both the clock and the delayed clock are at the high level, enabling the input data to be transferred to the output.

This structure is advantageous owing to the switching speed due to the pre-charge of the node M, but it is limited by the difficulty of obtaining the time window, defining a period of latch transparency that is long enough to allow the discharge of the node M.

Indeed, it is possible to have a situation in which the transistors MN1, MN2 and MN3 forming the discharge means of the node M are rather slow, while the inverters I1, I2 and I3 are rather fast. A configuration of this type can lead to an unfavorable situation, in which the time needed to discharge the node M through the battery MN1/MN2/MN3 is greater than the duration of the time window provided by the chain of inverters I1, I2, I3 during which transistor MN1 of the discharge battery is kept on. More specifically, as the inverter chain is rather fast, during a rising clock edge, it does not make it possible to produce a sufficiently long delay, which means that the delayed clock signal falls too quickly to be able to give the battery of nMos MN1, MN2 and MN3 the time to discharge the node M when the data signal Data is at the high level.

This defective operation of the latch can be explained by mismatches of the Mos transistors used, on the one hand, in the inverter-based delay chain CH and, on the other hand, in the path of nMos MN1, MN2 and MN3, occurring in their production. Thus, problems of repeatability in the transistor production method can mean that Mos transistors have characteristics that diverge with respect to those expected, which distorts the performance expected in terms of the current capable of being drawn by the Mos respectively from the inverter chain CH and the path MN1/MN2/MN3, capable of resulting in a defective operation in terms of the assembly's dynamics, as explained above.

One way of overcoming these undesirable effects related to mismatches is to have the delay produced by the delay chain be longer than the discharge time of the longest node M engaged by the transistor path MN1/MN2/MN3. One way of delaying the inverter chain CH in order to prepare for this worst-case scenario is to adjust the W/L ratio (W being the width and L being the length) of the transistors of the inverter chain CH so as to reduce the amount of current passed through by each of them.

However, such a choice intended to take into account in the delay chain worst-case delay of the discharge path MN1/MN2/MN3, while ensuring that the node M has the time necessary to be discharged through the path MN1/MN2/MN3, may impair the performance of the latch. Indeed, by thus increasing the duration of the time window defined by the delay chain, the duration of the transparency window of the latch, and therefore also the time of establishing and of maintaining the input data are increased, which may adversely affect the use of the latch, since it means that the input data must be held for a longer time, according to the time during which the inverter chain CH has not yet turned off the transistor MN1.

This choice of adjusting the W/L ratio of the transistors of the inverter chain with respect to the W/L ratio of the transistors of the path MN1/MN2/MN3, also has the disadvantage of not being capable of being implemented in all transistor production processes.

SUMMARY

An embodiment of this invention is therefore intended to solve one or more of these disadvantages by making it possible to best align the delay created by the inverter chain to the time necessary for the node M of the latch to be discharged through the path of nMos transistors, so as to obtain a bistable circuit better suited to the possible variations in the process for production of the transistors of the structure.

An embodiment of the invention thus relates to a bistable circuit switching at the edges of a clock signal, including means for pre-charging an intermediate node of the circuit, delay means defining a time window around an edge of said clock signal, means for discharging the intermediate node controlled by at least one input data item making it possible to discharge the intermediate node for the duration of said time window, wherein the delay means include means for temporally adjusting the duration of the time window to the time needed for the discharging of the intermediate node through said discharge means.

According to an embodiment, as the delay means include an inverter chain and the discharge means include a path of nMos transistors connected in series between the pre-charge means and a ground of the circuit, the means for time adjustment of the delay means are integrated at the level of a modified inverter of the inverter chain, in the form of a path of nMos transistors replicating the transistor path of the discharge means, connected in series with a pMos transistor of said inverter.

The means for discharging the intermediate node advantageously may also include a logic combination stage between at least two input data items of the circuit.

The logic combination stage may include a network of transistors arranged in the transistor path of the discharge means so as to perform a predetermined logic function between the input data items, wherein said transistors constituting the logic combination stage are each controlled respectively by one of the input data items.

The transistor path of the modified inverter of the delay chain advantageously may include a number of stages identical to that of the transistor path of the means for discharging the intermediate node.

According to an alternative, the transistor path of the modified inverter of the delay chain includes fewer stages than the transistor path of the means for discharging the intermediate node.

An embodiment of the invention also relates to a latch including a bistable circuit.

An embodiment of the invention relates to a flip-flop including a master latch and a slave latch, in which the master latch is a latch as described above.

BRIEF DESCRIPTION OF THE DRAWINGS

Features and advantages of one or more embodiments of this invention will become more clear upon reading the following description given by way of an illustrative and non-limiting example, in reference to the appended figures.

DETAILED DESCRIPTION

Figure 1:
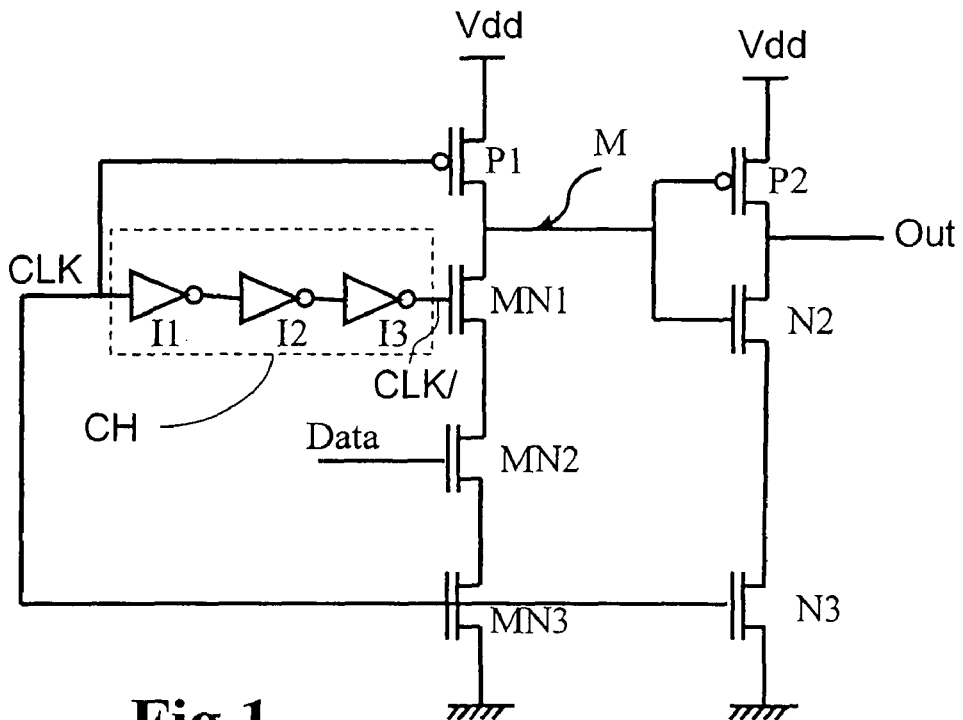
FIG. 1 shows the structure according to the prior art of the master portion of an HLFF-type flip-flop latch.

Starting with the bistable structure of FIG. 1, the time performance of the discharge path MN1/MN2/MN3 is transferred to the inverter chain CH producing the delay, so that if the transistors of the discharge path are slow, the delay chain will be slow and, conversely, if they are fast, the delay chain will be fast.

Figure 2:
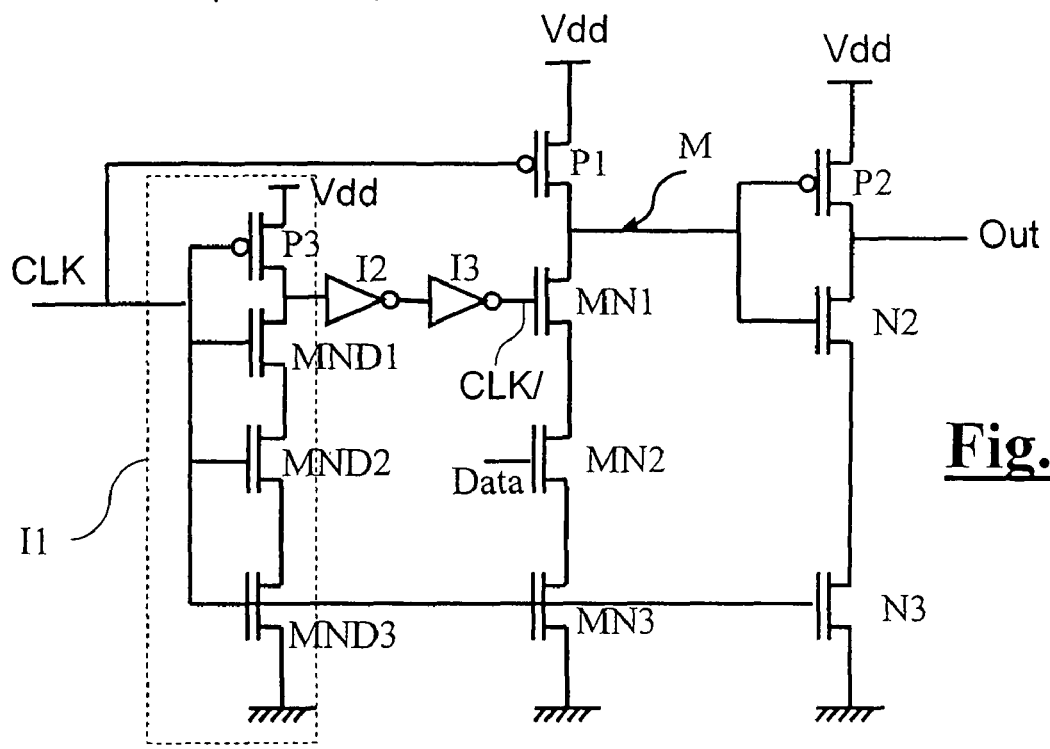
FIG. 2 shows the structure of FIG. 1 improved according to an embodiment of the invention.

FIG. 2 shows this principle, in which the elements already described in reference to FIG. 1 have the same reference.

In the example of FIG. 2, the inverter I1 of the delay chain is modified so as to integrate specific means that enable the delay chain CH to temporally adjust its delay to the discharge time needed to discharge the intermediate node M through the transistors MN1, MN2 and MN3 of the discharge path.

A conventional inverter includes a pMos transistor and an nMos transistor connected in series between the power supply and the ground and controlled on their gate by the same signal. The modified inverter I1 according to the example includes, in the place of a single nMos, multiple nMos transistors, respectively MND1, MND2 and MND3, connected in series between a pMos transistor P3 and the ground, all controlled by the same signal on their gate, which are intended to replicate the structure of the nMos transistors MN1, MN2 and MN3 of the discharge path at the level of the structure of the inverter I1.

Thus, with respect to a conventional inverter used in the delay chain, the modified inverter I1 may make it possible to more reliably transfer the behavior of the transistors of the discharge path when the node M is discharged. Indeed, when there is a clock edge, the clock signal switches to 1, and the capacitance formed between I1 and I2 is discharged through MND1, MND2 and MND3 to produce a 0, which will be propagated through I2 to make a 1, then through I3 to make a 0, which finally turns off the transistor MN1. The objective is to have the discharge through the transistors MND1, MND2 and MND3 of the inverter I1 replicate the discharge of the node M through the transistors MN1, MN2 and MN3 of the discharge path. The time of propagation through the conventional inverters I2 and I3 then normally forms the margin available in the time window defined by the delay chain for discharging the node M.

According to an alternative of the example described in FIG. 2, the inverter of the modified delay chain could just as well be the inverter located in the second (I2) or third (I3) position in the delay chain.

According to another embodiment described in reference to FIG. 2, the structure of the discharge path is replicated in the modified inverter I1, i.e. the path of nMos transistors MND1 to MND3 of the modified inverter I1 of the delay chain includes a number of stages, in this case three, identical to that of the path of nMos transistors MN1 to MN3 of the means for discharging the node M, wherein the sizes of the transistors of the discharge path and the modified inverter path, respectively, are also ideally identical.

However, this ideal configuration may be costly in terms of both consumption and space occupied on the circuit, although it makes it possible to ensure that the time for discharging the intermediate node M via the discharge path MN1/MN2/MN3 is substantially perfectly replicated through the path MND1/MND2/MND3 of the modified inverter of the delay chain.

In addition, the sizes of the transistors MND1/MND2/MND3 of the modified inverter of the delay chain may advantageously be chosen to be smaller than those of the transistors MN1/MN2/MN3 of the path for discharging the intermediate node, for example by a factor of 5, so as to find a compromise between the relatively reliable monitoring and consideration of the time for discharging the intermediate node in the delay chain and the constraints on consumption and bulk of the circuit.

An alternative solution for saving space would also be to remove an nMos transistor, i.e. transistor MND2 according to the example, of the modified inverter in the delay chain. This solution may be made, however, at the expense of a good time adaptation of the delay chain to the time for discharging the intermediate node through the discharge path.

Figure 3:
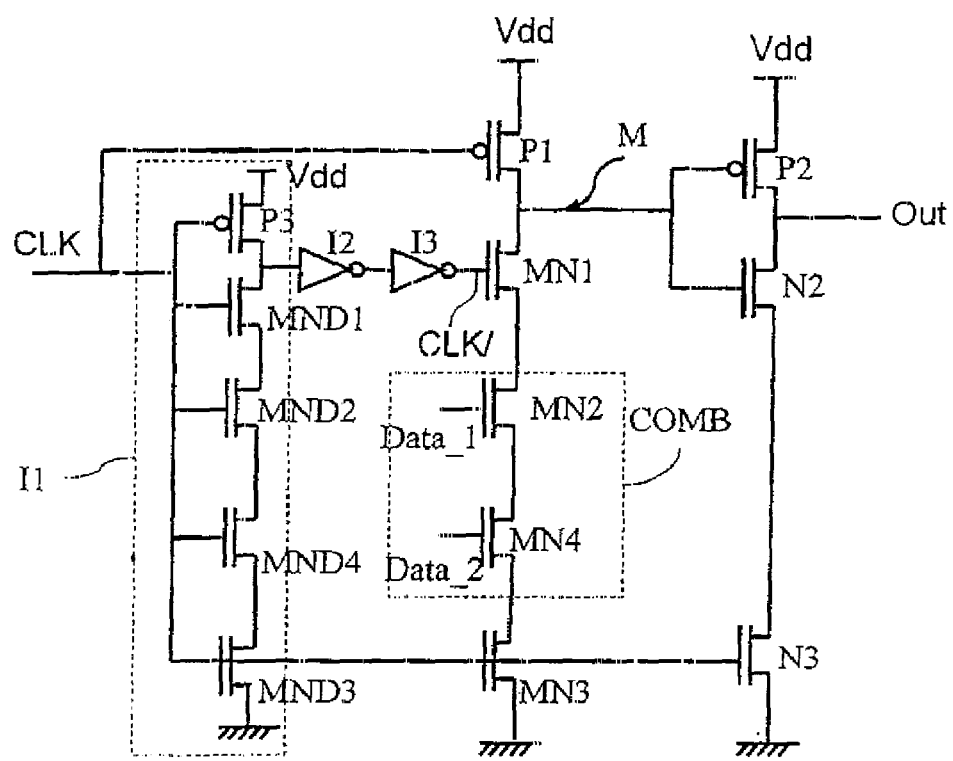
FIG. 3 shows an alternative embodiment of the invention.

Finally, an embodiment shown in FIG. 3 includes integrating a logic combination stage COMB in the means for discharging the intermediate node M. The logic combination stage COMB according to the example of FIG. 3 includes two nMos transistors MN2 and MN4, connected in series in the discharge path between transistors MN1 and MN3, respectively controlled by the input data Data1 and Data2, and in this way performs the AND logic function between the two input data items Data_1 and Data_2. The intermediate node M is then discharged by discharge means when both the data item Data_1 is 1 and the data item Data_2 is 1, and, therefore, results in the NOT AND logic operation (Data_1 AND Data_2), which amounts to integrating a NOT AND gate in the bistable circuit according to the example.

The use of an onboard logic function in the actual bistable circuit advantageously may make it possible to gain the delay created by the logic gate, which would otherwise be provided upstream of the bistable circuit in order to produce the logic function in question. Actually, a bit less than this delay is gained, because the combination of the logic gate with the bistable circuit requires an additional Mos to be added, MN4 according to the example, in the discharge path in order to produce the corresponding logic combination stage.

In this embodiment of the bistable with onboard logic via a network of nMos transistors integrated in the discharge means between transistors MN1 and MN3, to produce a predetermined logic function between input data items Data_1 to Data_n of the circuit, the modified delay chain CH according to an embodiment of the invention then may replicate the discharge path as explained above, therefore including the network of transistors of the discharge path performing the logic function.

Thus, according to the example of FIG. 3, the modified inverter I1 includes four transistor stages, respectively MND1, MND2, MND3 and MND4, in the same way that the modified discharge path, which includes integrated logic, includes the four transistor stages, respectively MN1, MN2, MN3 and MN4. In this way, the time window defined by the delay chain is best adapted to the time for discharging the node M via the discharge path with onboard logic.

One or both of the circuits of FIGS. 2 and 3 may be included in an integrated circuit (IC) such as a memory or microprocessor, which may be included in a system such as a computer system. In the system, the IC may be coupled to another IC such as a controller.

From the foregoing it will be appreciated that, although specific embodiments of the invention have been described herein for purposes of illustration, various modifications may be made without deviating from the spirit and scope of the invention.

What is claimed is:

1. Bistable circuit switching at the edges of a clock signal, including means for pre-charging an intermediate node of the circuit, delay means including a chain of inverters defining a time window around an edge of said clock signal, means for discharging the intermediate node controlled by at least one input data item and including a path of nMos transistors connected in series between the pre-charge means and a ground of the circuit, making it possible to discharge the intermediate node for the duration of said time window, wherein the delay means include means for temporally adjusting the duration of the time window to the time for discharging the intermediate node through said discharge means, wherein said time adjustment means are integrated at the level of an inverter of the inverter chain, in the form of a path of nMos transistors replicating the transistor path of the discharge means, connected in series with a pMos transistor of said inverter.

2. Circuit according to claim 1, wherein the means for discharging the intermediate node also include a logic combination stage between at least two input data items of the circuit.

3. Circuit according to claim 2, wherein the logic combination stage includes a network of transistors arranged in the transistor path of the discharge means so as to perform a predetermined logic function between the input data items, wherein said transistors constituting the logic combination stage are each controlled respectively by one of the input data items.

4. Circuit according to claim 1, wherein a transistor battery of a modified inverter of the delay chain includes the same number of stages as the transistor path of the means for discharging the intermediate node.

5. Circuit according to claim 1, wherein the transistor path of a modified inverter of the delay chain includes fewer stages than the transistor path of the means for discharging the intermediate node.

6. A latch, comprising:
a first node;
a first circuit having a first configuration of components, the first circuit operable to drive a data signal onto the first node a first time after being enabled; and
a second circuit having at least the first configuration of components, the second circuit operable to disable the first circuit a second time after the first circuit is enabled, the second time being equal to a sum of a pre-established delay time and substantially the first time.

7. The latch of claim 6 wherein the second circuit is operable to:
generate a disable signal substantially the first time after receiving a clock signal; and
disable the first circuit the pre-established delay time after generating the disable signal.

8. The latch of claim 6 wherein:
the first node comprises an output node; and
the data signal comprises an output data signal.

9. The latch of claim 6, further comprising:
an output node; and
a third circuit operable to drive an output data signal onto the output node after receiving the data signal.

10. A latch, comprising:
a first node;
a first circuit operable to drive a data signal onto the first node a first time after being enabled;
a second circuit operable to disable the first circuit a second time after the first circuit is enabled, the second time being equal to a sum of a pre-established delay time and substantially the first time; and
wherein the first circuit is operable to generate the data signal as a logical combination of a first input data signal and a second input data signal.

11. The latch of claim 6 wherein the first circuit is operable to generate the data signal in response to an input data signal.

12. A circuit, comprising:
a first node operable to hold a first charge level;
a first path coupled to the first node, operable to receive a first control signal, and operable to transition the first node from the first charge level to a second charge level a first delay time after the control signal transitions to a first signal level, the first path having a first delay circuit for causing the first delay time;
a second node operable to hold a third charge level and coupled directly to an element in the first path;
a second path coupled to the second node, operable to receive a second control signal, and operable to transition the second node from the third charge level to a fourth charge level approximately the first delay time after the second control signal transitions to a second signal level, the second path having a second delay circuit substantially similar to the first delay circuit for causing at least the first delay time; and
a signal generator coupled to the second node and operable to transition the first control signal to the first signal level a pre-established time after the second node transitions to the fourth charge level.

13. The circuit of claim 12 wherein:
the first path comprises a first set of transistors serially coupled between the first node and a third node; and the second path comprises a second set of transistors serially coupled between the second node and the third node.

14. An integrated circuit, comprising:
a first node;
a first circuit having a first configuration of components, the first circuit operable to drive a data signal onto the first node a first time after being enabled; and
a second circuit having at least the first configuration of components, the second circuit operable to disable the first circuit a second time after the first circuit is enabled, the second time being equal to a sum of a pre-established delay time and substantially the first time.

15. A system, comprising:
a first integrated circuit, comprising,
a first node,
a first circuit having a first configuration of components, the first circuit operable to drive a data signal onto the first node a first time after being enabled, and
a second circuit having at least the first configuration of components, the second circuit operable to disable the first circuit a second time after the first circuit is enabled, the second time being equal to a sum of a pre-established delay time and substantially the first time; and
a second integrated circuit coupled to the first integrated circuit.

16. The system of claim 15 wherein:
the first integrated circuit is disposed on a first die; and
the second integrated circuit is disposed on a second die.

17. The system of claim 15 wherein the first and second integrated circuits are disposed on a same die.

18. The system of claim 15 wherein the second integrated circuit comprises a controller.

19. A method, comprising:
enabling generation of a first signal from a second signal;
generating the first signal from the second signal a first delay time after the enabling, the first delay time caused by a first delay circuit having a first configuration of components;
disabling generation of the first signal from the second signal a second delay time after the enabling, the second delay time being equal to a sum of a pre-established delay time and substantially the first delay time, the second delay time caused by a second delay circuit having at least the first configuration of components.

20. The method of claim 19 wherein:
the enabling comprises causing a latch to enter a transparent state; and
the disabling comprises latching the first signal.

21. The method of claim 19 wherein:
the enabling comprises enabling generation of the first signal from a second signal in response to a clock edge; and
the disabling comprises disabling generation of the second signal in response to the clock edge.

22. The method of claim 19 wherein enabling generation of the first signal comprises enabling generation of the first signal from a combination of the second signal and a third signal.

23. An integrated circuit, comprising:
a delay circuit having an input node operable to receive a clock signal, an output node, and a plurality of delay elements serially coupled between the input and output nodes, wherein at least one delay element comprises a configuration for causing a first delay; and
a buffer that is substantially the same as the at least one of the delay elements, the buffer causing a second delay that consists of at most the first delay and including a first input node operable to receive the clock signal, a second input node coupled to the output node of the delay circuit, and an output node.

24. The integrated circuit of claim 23 wherein the buffer comprises an inverter including a plurality of serially coupled transistors wherein at least one transistor comprises a P-type MOS transistor and at least one transistor comprises an N-type MOS transistor and wherein the at least one delay element that is substantially the same as the buffer comprises an inverter including a plurality of serially coupled transistors wherein at least one transistor comprises a P-type MOS transistor that is substantially the same as the P-type MOS transistor of the buffer and at least one transistor comprises an N-type MOS transistor that is substantially the same as the at least one N-type MOS transistor of the buffer.

25. The integrated circuit of claim 23 wherein the buffer comprises a third input node operable to receive a data signal.

26. The integrated circuit of claim 23 wherein the buffer comprises:
- a P-type MOS transistor having a control node coupled to the input node of the delay circuit, a first drain/source node coupled to a first supply node and a second drain source node coupled to the output node of the buffer;
- a first N-type MOS transistor having a control node coupled to output node of the delay circuit, a first drain/source node coupled to the output node of the buffer and a second drain/source node;
- a second N-type MOS transistor having a control node coupled to a third input node of the buffer, a first drain/source node coupled to the second drain/source node of the first N-type MOS transistor and a second drain/source node; and
- a third N-type MOS transistor having a control node coupled to the input node of the delay circuit, a first drain/source node coupled to the second drain/source node of the second N-type MOS transistor and a second drain/source node coupled to a second supply node.

27. An integrated circuit, comprising:
a delay circuit having an input node operable to receive a clock signal, an output node, and a plurality of delay elements serially coupled between the input and output nodes; and
a buffer that is substantially the same as at least one of the delay elements, the buffer including a first input node operable to receive the clock signal, a second input node coupled to the output node of the delay circuit, and an output node;
wherein the delay circuit comprises:
- a P-type MOS transistor having a control node coupled to the input node of the delay circuit, a first drain/source node coupled to a first supply node and a second drain/source node;
- a first N-type MOS transistor having a control node coupled to the input node of the delay circuit, a first drain/source node coupled to the second drain/source node of the P-type MOS transistor and a second drain/source node;
- a second N-type MOS transistor having a control node coupled to a input node of the delay circuit, a first drain/source node coupled to the second drain/source node of the first N-type MOS transistor and a second drain/source node; and
- a third N-type MOS transistor having a control node coupled to the input node of the delay circuit, a first drain/source node coupled to the second drain/source node of the second N-type MOS transistor and a second drain/source node coupled to a second supply node.

28. The integrated circuit of claim 23 wherein each delay element comprises an inverter.

29. An integrated circuit, comprising:
a delay circuit having an input node operable to receive a clock signal, an output node, and a plurality of delay elements serially coupled between the input and output nodes; and
a buffer that is substantially the same as at least one of the delay elements, the buffer including a first input node operable to receive the clock signal, a second input node coupled to the output node of the delay circuit, and an output node;
wherein the buffer further comprises:
a third input node operable to receive a first data signal;
a fourth input node operable to receive a second data signal; and
a second output node operable to generate the resultant data signal that comprises a logical combination of the first data signal and the second data signal.

30. A system, comprising:
an integrated circuit, including:
a delay circuit having an input node operable to receive a clock signal, an output node, and a plurality of delay elements serially coupled between the input and output nodes, wherein at least one delay element comprises a configuration for causing a first delay; and
a buffer that is substantially the same as the at least one of the delay elements, the buffer causing a second delay that consists of at most the first delay and including a first input node operable to receive the clock signal, a second input node coupled to the output node of the delay circuit, and an output node.

* * * * *